(12) United States Patent
Cho

(10) Patent No.: US 8,076,729 B2
(45) Date of Patent: Dec. 13, 2011

(54) SEMICONDUCTOR DEVICE HAVING A DUAL GATE ELECTRODE AND METHODS OF MAKING THE SAME

(75) Inventor: Eun Sang Cho, Seoul (KR)

(73) Assignee: Dongbu Hitek Co., Ltd, Seoul (KR)

( * ) Notice: Subject to any disclaimer, the term of this patent is extended or adjusted under 35 U.S.C. 154(b) by 572 days.

(21) Appl. No.: 12/122,531

(22) Filed: May 16, 2008

(65) Prior Publication Data

US 2008/0315314 A1    Dec. 25, 2008

(30) Foreign Application Priority Data

May 21, 2007  (KR) .................. 10-2007-0049032

(51) Int. Cl.
*H01L 29/66* (2006.01)

(52) U.S. Cl. ........ 257/365; 257/369; 257/351; 257/412; 257/E21.623; 257/E21.637; 257/E21.027; 257/E21.177; 257/E21.179; 257/E21.421; 257/E21.632; 257/E21.635; 257/E21.674; 438/157; 438/176; 438/195; 438/197; 438/283; 438/652; 438/657

(58) Field of Classification Search .................. 257/365, 257/369, 412, 351, E21.623, E21.637, E21.027, 257/E21.177, E2, 1.179, E21.197, E21.421, 257/E21.632, E21.635, E21.674; 438/157, 438/176, 195, 197, 283, 652, 657

See application file for complete search history.

(56) References Cited

U.S. PATENT DOCUMENTS

| | | | | |
|---|---|---|---|---|
| 5,034,798 A | * | 7/1991 | Ohsima | 257/324 |
| 5,081,054 A | * | 1/1992 | Wu et al. | 438/258 |
| 5,094,967 A | * | 3/1992 | Shinada et al. | 438/258 |
| 5,607,868 A | * | 3/1997 | Chida et al. | 438/258 |
| 6,265,266 B1 | * | 7/2001 | Dejenfelt et al. | 438/258 |
| 6,346,445 B1 | * | 2/2002 | Hsu | 438/279 |
| 6,420,097 B1 | | 7/2002 | Pike et al. | |
| 6,458,659 B1 | * | 10/2002 | Pividori et al. | 438/258 |
| 6,784,054 B2 | | 8/2004 | Nitta et al. | |
| 6,897,095 B1 | * | 5/2005 | Adetutu et al. | 438/119 |
| 2002/0043683 A1 | * | 4/2002 | Nakagawa et al. | 257/315 |
| 2002/0045320 A1 | * | 4/2002 | Choi et al. | 438/303 |
| 2002/0151125 A1 | * | 10/2002 | Kim et al. | 438/199 |
| 2003/0222306 A1 | * | 12/2003 | Hoefler et al. | 257/347 |
| 2003/0235956 A1 | * | 12/2003 | Lindsay et al. | 438/264 |
| 2006/0003507 A1 | * | 1/2006 | Jung et al. | 438/197 |
| 2006/0068575 A1 | * | 3/2006 | Gluschenkov et al. | 438/585 |

* cited by examiner

*Primary Examiner* — Meiya Li
(74) *Attorney, Agent, or Firm* — Workman Nydegger

(57) ABSTRACT

Disclosed is a method for forming a dual gate electrode of a semiconductor device, which may improve manufacturing productivity by simplifying a process of forming gate electrodes in PMOS and NMOS regions, respectively, and may provide improvement in performance by making the two gate electrodes have a different thickness and material state in a manner that one of the two gate electrodes has a single-layer structure and the other one has a two-layer structure.

8 Claims, 6 Drawing Sheets

SEMICONDUCTOR DEVICE HAVING A DUAL GATE ELECTRODE AND METHODS OF MAKING THE SAME

CROSS-REFERENCE TO RELATED APPLICATION

This application claims priority to Korean Application No. 10-2007-0049032, filed on May 21, 2007, which is incorporated herein by reference in its entirety.

BACKGROUND

1. Field of the Invention

The present invention relates to semiconductor devices having a dual gate electrode, and methods for making the same. More particularly, embodiments of the present invention relate to methods for forming a dual gate electrode of a semiconductor device that improve manufacturing productivity and semiconductor performance.

2. Background of the Invention

Generally, in a MOSFET (Metal Oxide Semiconductor Field Effect Transistor) which is typical of a semiconductor device, a device isolation layer is formed in a semiconductor substrate, then a gate electrode is formed on the corresponding semiconductor substrate, and then source/drain regions with dopant ions implanted in the semiconductor substrate between the gate electrode and the device isolation layer are formed.

A MOSFET of this type with p-type dopant ions implanted in the source/drain regions is referred to as a p-channel MOSFET (i.e., PMOS transistor), and a MOSFET of this type with n-type dopant ions implanted therein is referred to as a n-channel MOSFET (i.e., NMOS transistor).

As above, since the semiconductor device having both PMOS and NMOS transistors has two gate electrodes, this structure is called a dual-gate electrode structure. The role of a gate electrode can be widened through two gate electrodes, and one gate electrode can be replaced by the other gate electrode.

Further, the corresponding gate electrodes should have excellent conductivity and a high melting point, and should be easily patternable, and hence they are formed of polysilicon material which is easily doped with impurities at a high concentration and able to maintain a stable form in a subsequent thermal process that is performed at a high temperature.

FIGS. 1a to 1i are process cross sectional views sequentially showing a conventional method for forming a dual gate electrode of a semiconductor device.

First, as shown in FIG. 1a, a first polysilicon layer 110 for forming a gate electrode of one region (e.g., PMOS region) is formed over the entire surface of a semiconductor substrate 100 having a gate insulating layer (not shown) thereon by a method, such as deposition.

As the corresponding deposition, an LPCVD (Low Pressure Chemical Vapor Deposition) can be preferably used.

Next, as shown in FIG. 1b, a first photoresist pattern 120 is formed by a typical photo-lithography process so as to close and define the corresponding PMOS region. The corresponding photo-lithography process may consist of a series of process steps of photoresist solution coating, exposure, and developing.

Next, as shown in FIG. 1c, the first polysilicon layer 110 of the region not closed by the first photoresist pattern 120 but exposed is removed by etching by using the corresponding first photoresist pattern 120 as an etching mask.

Thereafter, as shown in FIG. 1d, the first photoresist pattern 120 used is removed, whereupon a plasma ashing method can be used.

Hence, a first gate electrode 110' is formed in the PMOs region by the left first polysilicon layer.

Next, as shown in FIG. 1e, a second photoresist pattern 130 is formed by a photo-lithography process so as to close the formed first gate electrode 110' at the top and protect it.

Thereafter, as shown in FIG. 1f, a second polysilicon layer 140 for forming a gate electrode is formed in an NMOS region, which is another region on the other side by a method such as LPCVD, and accordingly, the second polysilicon layer 140 is formed, especially, in the portion including the NMOS region not closed by the second photoresist pattern 130 but exposed.

As is next shown in FIG. 1g, the second photoresist pattern 130 is removed by a method, such as plasma ashing.

Next, as shown in FIG. 1h, a third photoresist pattern 150 is formed by a photo-lithography process on the first gate electrode 110' and the second polysilicon layer 140 so as to be spaced from each other so as to close and define only the first gate electrode 110' of the PMOS region and the NMOS region.

Thereafter, as shown in FIG. 1i, the second polysilicon layer 140 around the NMOS region is removed by etching by an RIE method or the like by using the corresponding third photoresist pattern 150 as an etching mask while protecting the formed first gate electrode 110'.

Next, the third photoresist pattern 150 used is removed by a method, such as plasma ashing.

Hence, a second gate electrode 140' is formed in the NMOS region by the left second polysilicon layer.

As a result, the formation of a dual gate is completed.

However, the above-described conventional method for forming a dual gate of a semiconductor device can have a number of problems.

For example, manufacturing productivity is lowered due to complexity in the manufacturing process because three masking steps of the first to third photoresist patterns 120, 130, and 150 are used.

In particular, to improve the conductivity of the gate electrodes 110' and 140', p-type dopant ions are implanted into the gate electrode 110' of the PMOS region, and n-type dopant ions are implanted into the gate electrode 140' of the NMOS region. Even in the event of such ion implantation, masking is used, which introduces increased process complexity in due in part to the number of masking steps carried out.

Further, the gate electrodes 110' and 140' of the PMOS and NMOS regions are each formed in the same manner, and hence there is a limitation in obtaining performance improvement through different characteristics of each region.

SUMMARY OF SOME EXAMPLE EMBODIMENTS

In general, example embodiments of the invention relate to semiconductor devices having a dual gate electrode, as well as methods for forming a dual gate electrode of a semiconductor device. Disclosed embodiments provide a number of advantages over the prior art, including but not limited to improvements in manufacturing productivity by reducing masking steps, and improvement in performance by making gate electrodes of PMOS and NMOS regions have a different thickness and material state.

In accordance with an example embodiment, there is provided a method for forming a dual gate electrode of a semiconductor device, comprising the steps of: forming a first polysilicon layer over the entire surface of a semiconductor substrate; forming a first photoresist pattern on the first polysilicon layer so as to close a first region, the first region being one of a PMOS and an NMOS region; leaving the first polysilicon layer only in the first region by removing an exposed portion of the first polysilicon layer by etching using the first photoresist pattern; removing the first photoresist pattern; forming a second polysilicon layer over the entire surface of the left first polysilicon layer and semiconductor substrate; forming a second photoresist pattern on the second polysilicon layer so as to close the first region and so as to close and define a second region different from the first region; leaving the first and second polysilicon layers in a stack in the first region and leaving the second polysilicon layer in the second region by removing an exposed portion of the second polysilicon layer by etching using the second photoresist pattern; and removing the second photoresist pattern.

In another example embodiment, a semiconductor having a dual gate electrode is provided. In a disclosed embodiment, the semiconductor device includes a first and a second polysilicon layer stacked in a first region, and a second polysilicon layer stacked in a second region. By providing a device where one of the two gate electrodes has a single-layer structure and the other one has a two-layer structure, improvements in semiconductor performance are realized.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features will be set forth in the description which follows, and in part will be obvious from the description, or may be learned by the practice of the teachings herein. Features of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

Aspects of example embodiments of the invention will become apparent from the following description of example embodiments given in conjunction with the accompanying drawings, in which.

DETAILED DESCRIPTION OF EXAMPLE EMBODIMENTS

Figure 1A:
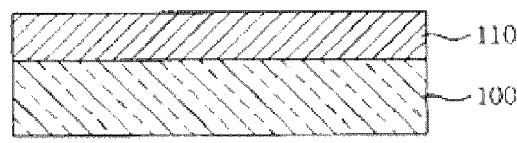
FIGS. 1a to 1i are process cross sectional views sequentially showing a conventional method for forming a dual gate electrode of a semiconductor device.
Figure 1B:
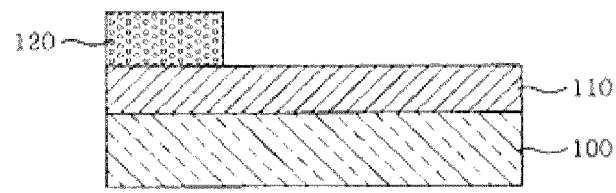
Figure 1C:
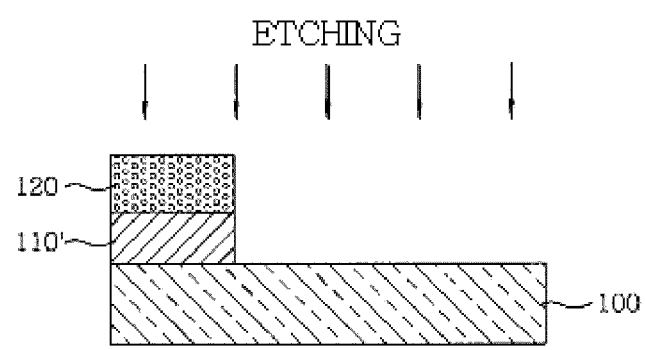
Figure 1D:
Figure 1E:
Figure 1F:
Figure 1G:
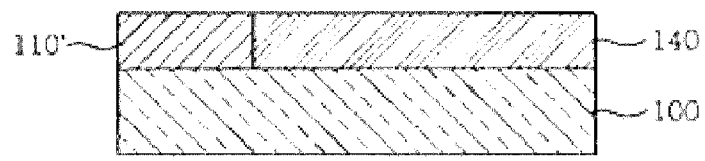
Figure 1H:
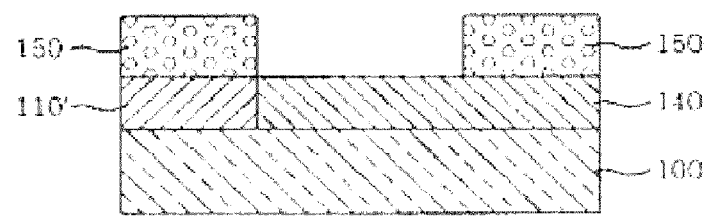
Figure 1I:
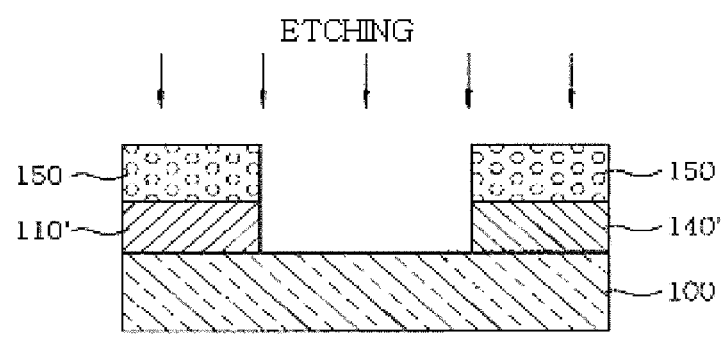

In the following detailed description of the embodiments, reference is made to the accompanying drawings that show, by way of illustration, specific embodiments of the invention. In the drawings, like numerals describe substantially similar components throughout the several views. These embodiments are described in sufficient detail to enable those skilled in the art to practice the invention. Other embodiments may be utilized and structural, logical and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

In forming a dual gate, respectively, in PMOS and NMOS regions in a semiconductor device having both PMOS and NMOS transistors, manufacturing productivity may be improved by reducing masking steps, and two gate electrodes can be made to have a different thickness and material characteristic, thereby achieving performance improvement.

In the conventional art, first, a first gate electrode of one region is patterned by using a first mask, a second polysilicon layer is formed with the corresponding first gate electrode closed and protected by a second mask, and then a second gate electrode is patterned by using a third mask. In contrast, in one embodiment of the present invention, a first gate electrode may be patterned by using a first mask, a second polysilicon layer may be formed on the formed first gate electrode, and then a dual gate may be formed by etching by using a second mask for closing and defining regions corresponding to each gate electrode.

FIGS. 2a to 2h are process cross sectional views sequentially showing a method for forming a dual gate electrode of a semiconductor device according to an example embodiment.

Figure 2A:
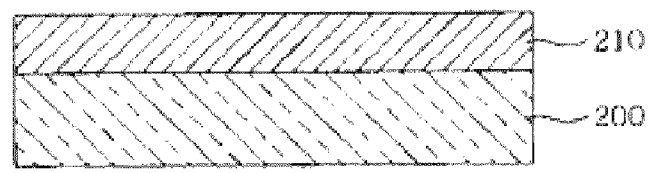
FIGS. 2a to 2h are process cross sectional views sequentially showing a method for forming a dual gate electrode of a semiconductor device according to an example embodiment.

First, as shown in FIG. 2a, a first polysilicon layer 210 for forming a gate electrode may be formed in one region (e.g., PMOS region) over the entire surface of a semiconductor substrate 200 having a gate insulating layer (not shown) on a surface by a method, such as LPCVD (Low Pressure Chemical Vapor Deposition).

Figure 2B:
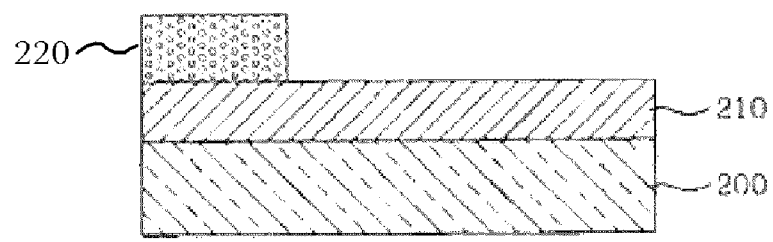

Next, as shown in FIG. 2b, a first photoresist pattern 220 may be formed by a typical photo-lithography process so as to close the PMOS region. The corresponding photo-lithography process may consist of a series of process steps of photoresist solution coating, exposure, and developing.

Figure 2C:
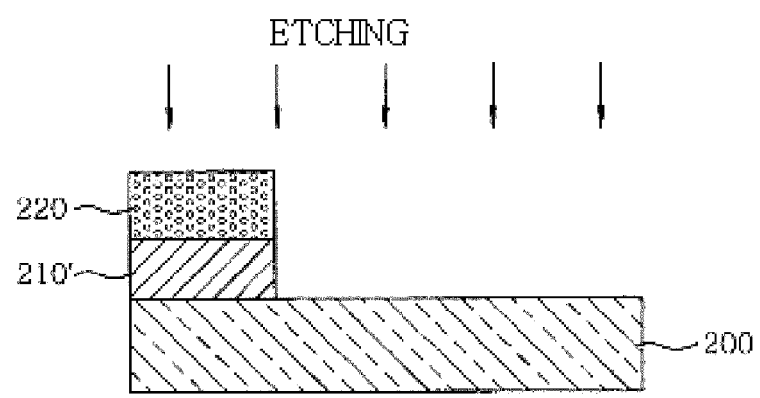

Subsequently, as shown in FIG. 2c, the first polysilicon layer 210 of the region not closed by the first photoresist pattern 220 but exposed may be removed by etching by an RIE (Reactive Ion Etching) method by using the corresponding first photoresist pattern 220 as an etching mask.

Figure 2D:
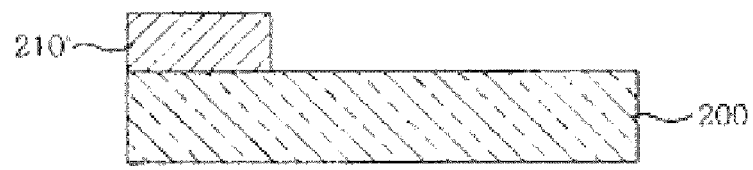

Thereafter, as shown in FIG. 2d, the first photoresist pattern 220 used may be removed by a method, such as plasma ashing.

Hence, a first gate electrode 210' is left only in the PMOs region.

Figure 2E:
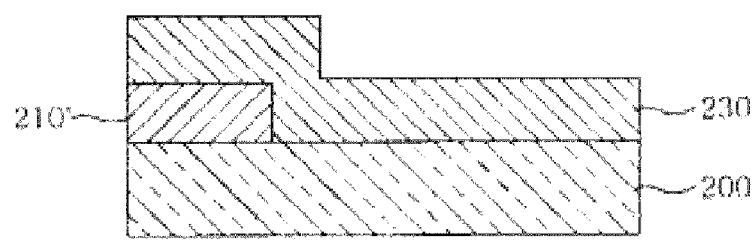

Next, as shown in FIG. 2e, a second polysilicon layer 230 may be formed over the entire surface of the left first polysilicon layer 210' and exposed semiconductor substrate 200 by a method, such as LPCVD.

Figure 2F:
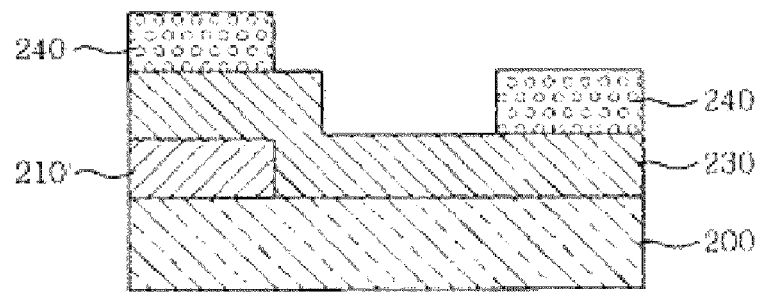

Thereafter, as shown in FIG. 2f, a second photoresist pattern 240 may be formed by a photo-lithography process on lateral portions of the second polysilicon layer 230 so as to close and define PMOS and NMOS regions, respectively.

Figure 2G:
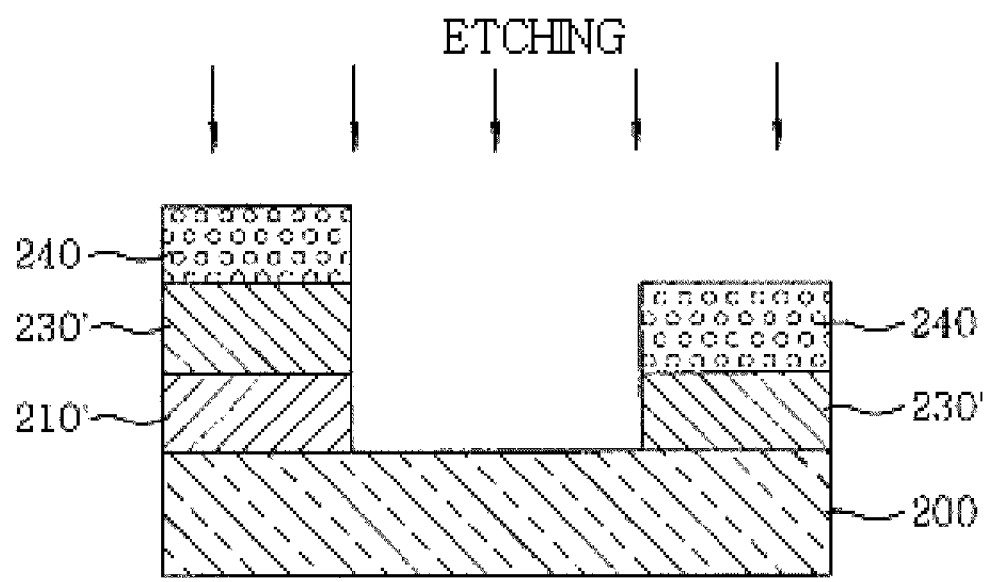

Subsequently, as shown in FIG. 2g, the second polysilicon layer 230 of the regions not closed by the second photoresist pattern 240 but exposed may all be removed by etching by an RIE method or the like by using the second photoresist pattern 240 formed on lateral portions as an etching mask.

The removal of the exposed portion of the second polysilicon layer 230 may be done until the semiconductor 200 at the bottom is exposed.

Therefore, the first polysilicon layer 210' and the second polysilicon layer 230' may be left in a stack in the defined PMOS region, and only the second polysilicon layer 230' may be left in the defined NMOS region.

Figure 2H:
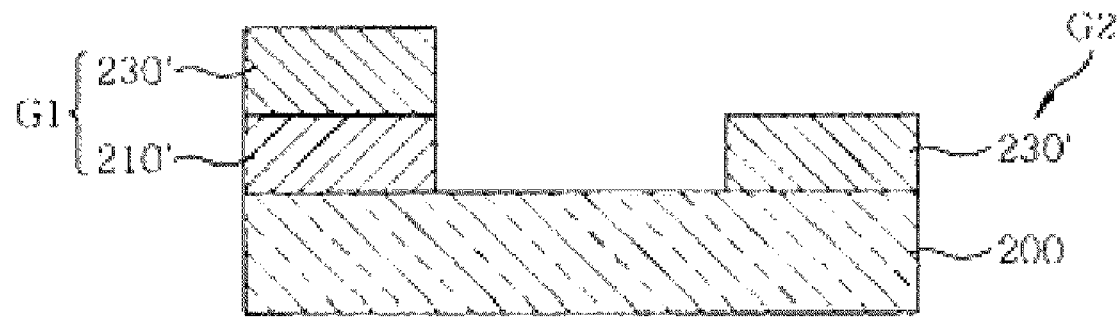

As shown in FIG. 2h, the second photoresist pattern 240 may then be removed by a method, such as plasma ashing.

Hence, a first gate electrode G1 may be formed in a two-layer structure of the first polysilicon layer 210' and second polysilicon layer 230' left in the PMOS region, and a second gate electrode G2 may be formed by the second polysilicon layer 230' left in the NMOS region.

As a result, the formation of a dual gate may be completed.

Other embodiments than that which has been described are contemplated. For example, although the description has been made with respect to the case where the gate electrode G1 of the PMOS region is formed in a two-layer structure and the gate electrode G2 of the NMOS region is formed in a single layer structure, the gate electrodes can be formed vice versa, i.e., gate electrode G1 can be formed in a single layer structure and gate electrode G2 can be formed in a two-layer structure.

According to the above-described embodiments, it is possible to form a dual gate properly by two masking steps using the first and second photoresist patterns 220 and 240, and this may lead to improvement in manufacturing productivity caused by the reduction in process steps as compared to the conventional three masking steps.

In addition, it is possible to seek performance improvement by a change in characteristics caused by a thickness difference because one of the gate electrodes may be formed in a two-layer structure and the other gate electrode may be formed in a single-layer structure.

Furthermore, it is possible to seek performance improvement by a change in characteristics caused by differences between the first and second polysilicon layers because the first polysilicon layer 210 and the second polysilicon layer 230 are formed to have the same or different material state or doping state.

For this, a different material state or doping state can be realized by controlling a process gas or the like in the deposition and formation of the two polysilicon layers 210 and 230.

Moreover, in forming the first photoresist pattern 220 so as to define the PMOS region and performing etching by using the same in the above-described steps of FIGS. 2b and 2c, the first photoresist pattern 220 need not define a precise region because the corresponding PMOS region may be defined again by using the second photoresist pattern 240 in the subsequent steps of FIGS. 2f and 2g. Thus, a region defined by the first photoresist pattern 220 may be larger or smaller than the corresponding region defined by the second photoresist pattern 240.

In addition, in order to remove the thickest portion of the two-layer structure when etching by using the second photoresist pattern 240 in the step of FIG. 2g, the thickness of the corresponding second photoresist pattern 240 may be sufficiently large so as to endure upon etching (e.g., thicker than the first photoresist pattern 220). However, it may be difficult to form the second photoresist pattern 240 at a sufficiently large thickness, and thus a thin film pattern (not shown) for a hard mask can be used in place of the corresponding second photoresist pattern 240.

In one example embodiment, the corresponding thin film pattern for a hard mask can be formed by a combination of a photo-lithography process and a subsequent etching process, and its material can be an oxide film or nitride film.

As described above, since a dual gate can be formed by using only two masking steps, as compared to the conventional three masking steps, manufacturing productivity can be improved by reduction in process steps. In addition, since two gate electrodes can be formed with a different thickness and material state, performance improvements can be achieved in the semiconductor device.

While the invention has been shown and described with respect to certain embodiments, it will be understood by those skilled in the art that various changes and modifications may be made without departing from the spirit and scope of the invention as defined in the following claims.

What is claimed is:

1. A method for forming a dual gate electrode of a semiconductor device, comprising the steps of:
   forming a first polysilicon layer over the entire surface of a semiconductor substrate;
   forming a first photoresist pattern on the first polysilicon layer so as to close a first region, the first region being one of a PMOS and an NMOS region;
   leaving the first polysilicon layer only in the first region by removing an exposed portion of the first polysilicon layer by etching using the first photoresist pattern;
   removing the first photoresist pattern;
   forming a second polysilicon layer over the entire surface of the first polysilicon layer and semiconductor substrate;
   wherein the second polysilicon layer is directly contact with the first polysilicon layer;
   forming a second photoresist pattern on the second polysilicon layer so as to close the first region and so as to close and define a second region different from the first region;
   leaving the first and second polysilicon layers in a stack in the first region and leaving the second polysilicon layer in the second region by removing an exposed portion of the second polysilicon layer until the semiconductor substrate is exposed by etching using the second photoresist pattern; and
   removing the second photoresist pattern;
   wherein the first region is formed in a two-layer structure which includes the first polysilicon layer and the second polysilicon layer, and
   wherein the second region is formed in a single layer structure which includes the second polysilicon layer.

2. The method of claim 1, wherein the first polysilicon layer and the second polysilicon layer are formed in the same material state.

3. The method of claim 1, wherein the first polysilicon layer and the second polysilicon layer are formed in the same doping state.

4. The method of claim 1, wherein a thin film pattern for a hard mask is used in place of the second photoresist pattern.

5. The method of claim 4, wherein the material of the thin film pattern for a hard mask is an oxide film or nitride film.

6. The method of claim 5, wherein thin film pattern for a hard mask is formed by a combination of a typical photo-lithography process and a subsequent etching process.

7. The method of claim 1, wherein the first polysilicon layer and the second polysilicon layer are formed in different material states.

8. The method of claim 1, wherein the first polysilicon layer and the second polysilicon layer are formed in different doping states.

* * * * *